US012676686B2

(12) United States Patent
Steffan

(10) Patent No.: US 12,676,686 B2
(45) Date of Patent: Jul. 7, 2026

(54) METHOD AND SYSTEM FOR IMPORTING ANTENNA CONFIGURATION

(71) Applicant: Rohde & Schwarz GmbH & Co. KG, Munich (DE)

(72) Inventor: Byron-Lim Timothy Steffan, Munich (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 748 days.

(21) Appl. No.: 17/950,441

(22) Filed: Sep. 22, 2022

(65) Prior Publication Data

US 2024/0106552 A1 Mar. 28, 2024

(51) Int. Cl.
 H04B 17/382 (2015.01)
 G01R 29/10 (2006.01)
 H04B 17/10 (2015.01)

(52) U.S. Cl.
 CPC .......... H04B 17/382 (2015.01); G01R 29/10 (2013.01); H04B 17/101 (2015.01)

(58) Field of Classification Search
 CPC ..... H04B 17/382; H04B 17/101; G01R 29/10
 USPC ........................................................ 342/169
 See application file for complete search history.

(56) References Cited

U.S. PATENT DOCUMENTS

| 8,031,940 B2 | 10/2011 | Vincent | |
| 10,802,066 B1 * | 10/2020 | Keaveney | G01R 29/10 |

| 2015/0264590 | A1 * | 9/2015 | Michl | H04W 24/06 |
| | | | | 455/67.14 |
| 2016/0259991 | A1 | 9/2016 | George | |
| 2017/0223559 | A1 * | 8/2017 | Kong | H04B 7/0413 |
| 2019/0036621 | A1 * | 1/2019 | Vanwiggeren | G01R 29/105 |
| 2019/0356397 | A1 * | 11/2019 | DaSilva | G01R 1/045 |
| 2020/0244377 | A1 * | 7/2020 | Maruo | H04B 17/24 |
| 2021/0342623 | A1 * | 11/2021 | Skarda | G06V 20/41 |
| 2022/0077938 | A1 * | 3/2022 | Laabs | H04B 17/21 |

FOREIGN PATENT DOCUMENTS

EP 3905134 A1 11/2021

OTHER PUBLICATIONS

Blankenbach et al. "Advanced Optical Supervision of Automotive Displays for Highest Safety Levels," Proceedings vol. 11708, Advances in Display Technologies XI; 117080D (2021) https://doi.org/10.1117/12.2576931, Mar. 5, 2021 (Year: 2021).*
Rossum, "AI-powered OCR API for Any Document Layout," https://rossum.ai/lp/ocr-api/?__hstc=43953530.7344afeec436fdd3859e2cc2ca8de982.1664967506385.1664967506385.1664967506385.1&__hssc=43953530.1.1664967506386&__hsfp=129929794, May 10, 2022.

(Continued)

*Primary Examiner* — Samarina Makhdoom
(74) *Attorney, Agent, or Firm* — DITTHAVONG, STEINER & MLOTKOWSKI

(57) ABSTRACT

A method is provided for importing at least one antenna configuration for a device under test (DUT) into a test and measurement (TM) system. The method is performed by the TM system and comprises the steps of receiving data comprising antenna configuration information related to the DUT, extracting the at least one antenna configuration for the DUT from the antenna configuration information in the data in a digital domain, and storing the extracted antenna configuration into settings of the TM system.

14 Claims, 4 Drawing Sheets

200

(56)  References Cited

OTHER PUBLICATIONS

Keysight, "PathWave Test Software, PathWave BenchVue Software, Software apps for easy instrument control and simplified automation," https://www.keysight.com/us/en/products/software/pathwave-test-software/benchvue-software.html., 2000.
Keysight, "Antenna Setup (MIMO)," https://rfmw.em.keysight.com/wireless/helpfiles/n5106a/antenna_setup.htm.
Honeywell, Bar Code Scanners, "How to Configure an OCR template and enable OCR reading?," https://support.honeywellaidc.com/s/article/How-to-Configure-an-OCR-template-and-enable-OCR-reading, Feb. 17, 2021.

* cited by examiner

100

Receiving data comprising antenna configuration information related to a DUT — 101

Extracting at least one antenna configuration for the DUT from the antenna configuration information in the data in a digital domain — 102

Storing the extracted antenna configuration into settings of a TM system — 103

200

300

| ANTENNA | BAND |
| --- | --- |
| ANT0 | BAND0 |
| ANT1 | BAND1 |
| ANT2 | BAND2 |
| ANT3 | BAND3 |
| ANT4 | BAND4 |
| ANT5 | BAND5 |
| ANT6 | BAND6 |

METHOD AND SYSTEM FOR IMPORTING ANTENNA CONFIGURATION

TECHNICAL FIELD

The present disclosure relates to antenna configuration of a device under test (DUT) for a test and measurement (TM) system, and in particular to a method and a TM system for automatically importing the antenna configuration of the DUT.

BACKGROUND

Generally, for testing one or more characteristics of a DUT with a TM system, wherein the DUT is capable of wireless communication and comprises one or more antennas, an antenna configuration of the DUT may be required by the TM system. The antenna configuration of the DUT may be inserted into the TM system, e.g. from a data sheet of the DUT. The TM system can then route wireless test signals to at least one desired antenna of the DUT according to the antenna configuration.

Conventionally, the insertion of the antenna configuration into the TM system is performed manually. For instance, data, e.g., comprising DUT radio frequency (RF) bands, connector properties, and the like, can be obtained from the data sheet of the DUT and added to the settings of the TM system. However, such a manual insertion of the antenna configuration is very cumbersome, especially in test houses that perform a high number and a wide variety of DUT tests. In addition, there is a high chance of error caused by incorrect data input.

Accordingly, there is a need for an automatic scheme for importing DUT antenna configuration into a TM system, and for facilitating a less error prone and a more flexible testing of DUT characteristics.

SUMMARY

Embodiments of the present invention advantageously address the foregoing requirements and needs, as well as others, by providing an automatic scheme for importing DUT antenna configuration into a TM system, and for facilitating a less error prone and a more flexible testing of DUT characteristics.

According to a first aspect of this disclosure, a method is provided for importing at least one antenna configuration for a DUT into a TM system, the method being performed by the TM system and comprises the steps of receiving data comprising antenna configuration information related to the DUT, extracting the at least one antenna configuration for the DUT from the antenna configuration information in the data in a digital domain, and storing the extracted antenna configuration into settings of the TM system.

The method of the first aspect enables an automatic scheme to import the DUT antenna configuration into the TM system, so that a user may test corresponding DUT antenna characteristics. The automatic scheme comprises digitally extracting the antenna configuration from the antenna configuration information contained in the received data. This scheme is more flexible and less error prone than, for example, inserting the antenna configuration manually into the settings of the TM system.

The antenna configuration information in the received data may comprise the antenna configuration, or all information necessary to assemble the antenna configuration, and the method may extract the necessary information. The antenna configuration information may also be indicative of the antenna configuration, and extracting the antenna configuration from the antenna configuration information may comprise generating the antenna configuration based on the antenna configuration information.

The data may be image data, and the antenna configuration information may be information in the image data. The antenna configuration information may thereby be in the form of image information, or text information, or the like. The data may also be provided as a table. The data may be in a format that is not in the desired format of the TM system. The TM system may perform the method. The TM system may comprise a processor configured to extract and store the antenna configuration into the settings. The TM system may comprise a receiver and one or more antennas, in order to receive the data. The data may, however, be inserted into the TM system in a different manner, e.g., over a wired interface.

In an implementation form of the first aspect, the method further comprises the step of routing at least one test signal to at least one target antenna of the DUT based on the antenna configuration for the DUT stored in the settings of the TM system.

The signal routing to the one or more target DUT antennas can be performed in a flexible and an accurate manner according to the imported antenna configuration. The TM system may comprise a transmitter and one or more antennas to send the one or more test signals to the DUT according to the antenna configuration.

In an implementation form of the first aspect, the method further comprises the step of extracting the antenna configuration of the DUT from the data in the digital domain using a pattern recognition algorithm.

The automatic extraction of the DUT antenna configuration for import into the TM system settings can thus be accurately and easily achieved by means of pattern recognition techniques, for instance, from image data.

In an implementation form of the first aspect, the data is image data comprising the configuration information and the method further comprises the step of extracting the antenna configuration of the DUT from the image data in the digital domain using an image pattern recognition algorithm and/or image processing algorithm.

The automatic data extraction for importing the DUT antenna configuration into the TM system settings can be achieved by means of image pattern recognition techniques and/or image processing techniques. That is, image data may be used as input to the TM system. The image pattern recognition algorithm and/or image processing algorithm may be performed by the TM system using a processor. The processor may carry out the algorithm based on a trained model. The trained model may be a neural network, which may be stored in a memory of the TM system.

In an implementation form of the first aspect, the method further comprises the step of providing reference image data comprising reference antenna configuration information as training data for the image pattern recognition algorithm and/or the image processing algorithm.

For instance, the reference data may correspond to the same DUT or to a same type of DUT than that to be tested, especially with the same or same type of antenna configuration. Alternatively, the reference data may correspond to a DUT similar to the DUT to be tested, but having different antenna configuration compared to the DUT to be tested. Advantageously, a wide range of reference data can be provided to train the image pattern recognition algorithm and/or the image processing algorithm, especially to train the image pattern recognition algorithm and/or the image processing algorithm to effectively extract the antenna configuration from the antenna configuration information.

In an implementation form of the first aspect, the data comprises the antenna configuration information in a tabular form.

In this regard, the data may comprise the antenna characteristics of the DUT, RF bandwidths, protocol specific information, and the like.

In an implementation form of the first aspect, the image data comprises the antenna configuration information as one or more annotations superposed on an image of the DUT.

In this regard, the one or more annotations may further indicate an antenna specific frequency band mapping. For example, the annotations may indicate the antenna characteristics of the DUT, RF bandwidths, protocol specific information, and the like.

In an implementation form of the first aspect, the data comprising the antenna configuration information corresponds to a product specification datasheet of the DUT.

The DUT antenna configuration can be digitally extracted from a DUT data sheet, which may improve the accuracy of the DUT testing. Additionally, the reference data for training the image pattern recognition algorithm and/or the image processing algorithm may correspond to the DUT data sheet, e.g. to a same or similar type of DUT data sheet, to effectively extract the antenna configuration from the DUT data sheet.

In an implementation form of the first aspect, the method further comprises the steps of receiving the image data comprising the antenna configuration information of the DUT as an JPEG file, determining one or more regions of interest indicating the antenna configuration information in the JPEG file, and extracting the antenna configuration for the DUT from the one or more regions of interest.

Advantageously, a user may add annotations and/or may highlight regions of interest in the JPEG file before or after receiving the file for data extraction, especially to extract the antenna configuration for the DUT from the annotated or highlighted regions of interest.

According to a second aspect of this disclosure, a TM system is provided for importing at least one antenna configuration of a DUT. The TM system comprises an interface configured to receive data comprising antenna configuration information related to the DUT, a processor operably coupled to the interface and configured to extract the at least one antenna configuration of the DUT from the antenna configuration information in the data in a digital domain, and a network emulator operably coupled to the processor. The processor is further configured to store the extracted antenna configuration into settings of the TM system.

In an implementation form of the second aspect, the network emulator is configured to route at least one test signal to at least one target antenna of the DUT based on the antenna configuration for the DUT stored in the settings of the TM system.

In an implementation form of the second aspect, the data is image data and the processor is configured to perform a pattern recognition and/or image processing algorithm to extract the antenna configuration of the DUT from the image data in digital domain.

In an implementation form of the second aspect, the TM system further comprises a database operably coupled to the interface, whereby the interface is configured to provide reference image data comprising reference antenna configuration information as training data to the database for storing the reference image data into the database. In this regard, the processor may perform the pattern recognition algorithm and/or the image processing algorithm based on the training data to extract the antenna configuration of the DUT from the antenna configuration information in the image data in the digital domain.

In particular, the training data may be used to train a model, for instance, a neural network in the TM system, and the processor may then apply the model to received data to extract the antenna configuration. The neural network may be a convolutional neural network (CNN) and/or deep neural network (DNN).

In an implementation form of the second aspect, the interface is configured to receive the image data by means of a digital capture and/or scanning and/or inputting of the image data related to the DUT.

The TM system of the second aspect and its implementation forms may achieve the same advantages as described above for the method of the first aspect and its respective implementation forms.

It is to be noted that the system according to the second aspect corresponds to the method according to the first aspect and its implementation forms. Accordingly, the system of the second aspect may have corresponding implementation forms and may achieve the same advantages and effects as the method of the first aspect, and vice versa.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

The above described aspects and implementation forms will be explained in the following description of specific embodiments in relation to the enclosed drawings, in which:

FIG. 3 shows an exemplary tabular data with DUT antenna configuration information.

DETAILED DESCRIPTION

An automatic scheme for importing DUT antenna configuration into a TM system, and for facilitating a less error prone and a more flexible testing of DUT characteristics, are described. In the following description, for the purposes of explanation, numerous specific details are set forth in order to provide a thorough understanding of the invention. It is apparent, however, that the invention may be practiced without these specific details or with an equivalent arrangement. In other instances, well-known structures and devices are shown in block diagram form in order to avoid unnecessarily obscuring the invention.

A processor, unit, module or component (as referred to herein) may be composed of software component(s), which are stored in a memory or other computer-readable storage medium, and executed by one or more processors or CPUs of the respective devices. A module or unit may alternatively be composed of hardware component(s) or firmware component(s), or a combination of hardware, firmware and/or software components. Further, with respect to the various example embodiments described herein, while certain of the functions are described as being performed by certain components or modules (or combinations thereof), such descriptions are provided as examples and are thus not intended to be limiting. Accordingly, any such functions may be envisioned as being performed by other components or modules (or combinations thereof), without departing from the spirit and general scope of the present invention. Moreover, the methods, processes and approaches described herein may be processor-implemented using processing circuitry that may comprise one or more microprocessors, application specific integrated circuits (ASICs), field programmable gate arrays (FPGAs), or other devices operable to be configured or programmed to implement the systems and/or methods described herein. For implementation on such devices that are operable to execute software instructions, the flow diagrams and methods described herein may be implemented in processor instructions stored in a computer-readable medium, such as executable software stored in computer memory storage.

Reference will now be made in detail to exemplary embodiments of the present disclosure, examples of which are illustrated in the accompanying drawings. However, the following embodiments of the present disclosure may be variously modified and the range of the disclosure is not limited by the following embodiments. Reference signs for similar entities in different embodiments are partially omitted.

Figure 1:
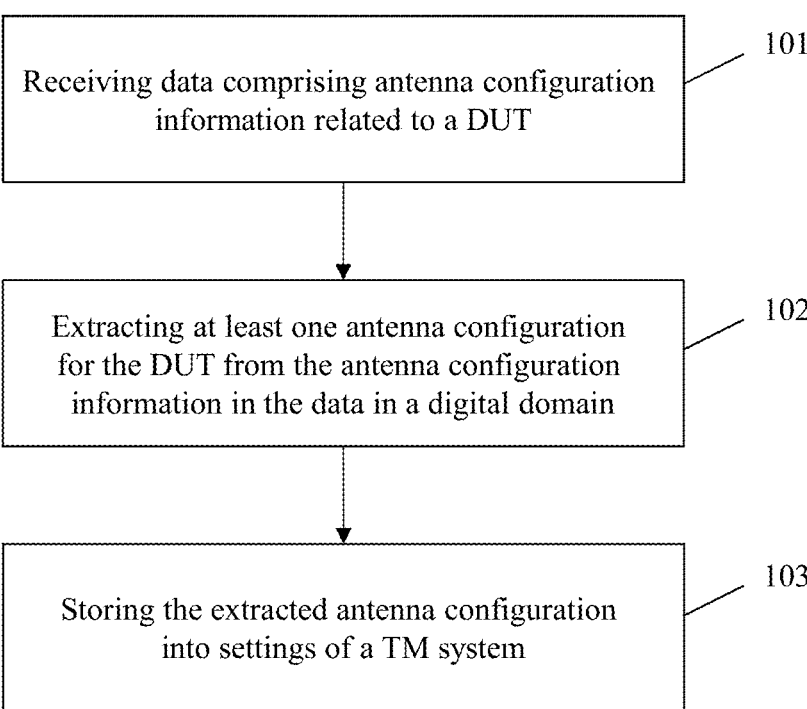
FIG. 1 shows an exemplary flow diagram of a method according to an embodiment of this disclosure.

In FIG. 1, an exemplary embodiment of the method 100 according to the first aspect of this disclosure is illustrated. In a first step 101, data comprising antenna configuration information related to a DUT is received. In a second step 102, at least one antenna configuration for the DUT is extracted from the antenna configuration information comprised in the data, wherein the extraction is performed in a digital domain. In a third step 103, the extracted antenna configuration is stored into settings of a TM system. The extraction may be automatically performed by the TM system, for instance, by a processor of the TM system upon receipt of the data.

Figure 2:
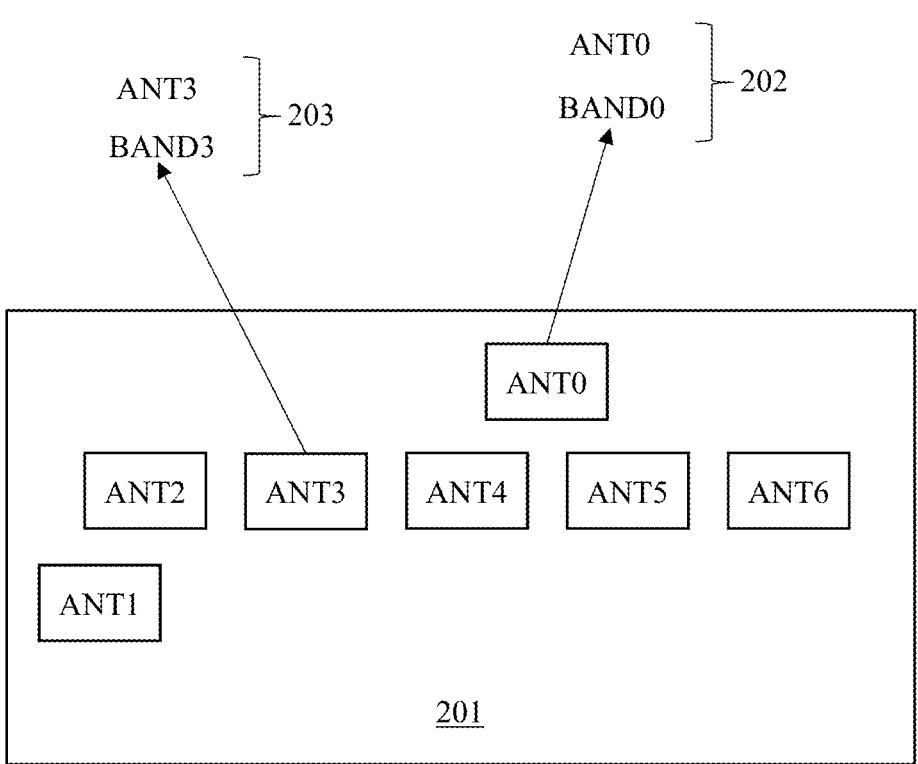
FIG. 2 shows an exemplary image data comprising DUT antenna configuration information.

The received data may comprise image data. In FIG. 2, an exemplary image data 200 including DUT antenna configuration information is illustrated. The image data 200 may correspond to an image of the DUT 201, to which the antenna configuration information relates. Especially, to an image of the DUT 201 where an antenna layout of antennas ANT0-ANT6 (seven antennas is only an example) of the DUT 201 is superposed. The image data 200 may further comprise annotations 202, 203 corresponding to the one or more antennas ANT0-ANT6. These annotations may have been added by a user. The superpose antenna layout and, optionally, the annotations, may form the antenna configuration information in the image data 202. Form this antenna configuration information, the antenna configuration is extractable.

For example, the ANT0 may be specified in the image data 200 with annotations 202 showing the antenna frequency band mapping BAND0 of ANT0. Similarly, the ANT3 may be specified in the image data 200 with annotations 202 showing the antenna frequency band mapping BAND3 of ANT3. Furthermore, one or more antenna specific frequency band mappings may be highlighted in the image data 200 and specify one or more regions of interest in the image data 200, from which antenna configuration may be extracted. In this regard, the annotations may further be color coded to highlight the one or more regions of interest in the image data 200.

The image data 200 may be formed based on a data sheet of the DUT 201, especially may comprise the antenna layout ANT0-ANT6 from the data sheet superimposed onto the image of the DUT 201. The annotations may correspond to the antenna specific frequency band mapping defined in the data sheet, and may further include antenna characteristics of the DUT, e.g., RF bandwidths, protocol specific information, and the like, based on the data sheet.

The received data may also comprise tabular data. In FIG. 3, an exemplary tabular data 300 with DUT antenna configuration information is illustrated. The tabular data 300 may correspond to the DUT 201 of FIG. 2. In this regard, the tabular data 300 may comprise a table with a plurality of columns, wherein each of the columns may list an antenna characteristic of the DUT 201 as the antenna configuration information. From this antenna configuration information, the antenna configuration is extractable.

For example, a first column in the tabular data 300 may list the antennas ANT0-ANT6 of the DUT 201, and a second column in the tabular data 300 may list the antenna specific frequency band mapping BAND0-BAND6. The tabular data 300 may further comprise additional columns to list the diversity scheme, orientation, protocol specific information, and the like of each of the antennas ANT0-ANT6 of the DUT 201.

The tabular data 300 may be in the form of a text file comprising digitized textual data regarding the antenna configuration information of the DUT 201. Alternatively, the tabular data 300 may be an image file or JPEG file corresponding to an image of a table comprising the antenna configuration information of the DUT 201. In the latter case, specific regions of interest in different columns may be highlighted to specify one or more regions of interest to be extracted.

The tabular data 300 may be formed based on the data sheet of the DUT 201, especially by reproducing the antenna specific information from the data sheet in the tabular form. Alternatively, the tabular data 300 may correspond to one or more tables available in the data sheet. The columns may comprise the antenna specific frequency band mapping as well as further antenna specific information of the DUT 201 based on the data sheet.

Figure 4:
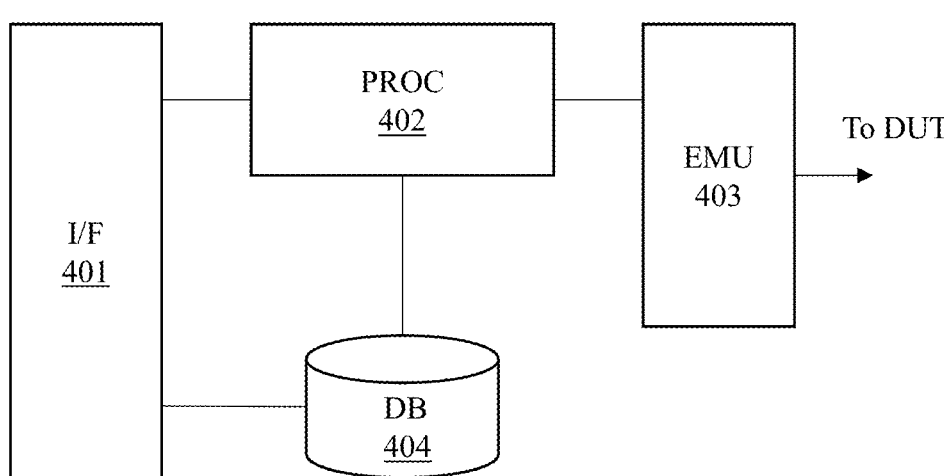
FIG. 4 shows an exemplary block representation of a TM system according to an embodiment of this disclosure.

In FIG. 4, an exemplary block representation of a TM system 400 according to the second aspect of this disclosure is illustrated. The TM system 400 may comprise an interface 401 for receiving and/or providing data, e.g. the image data 200 and/or the tabular data 300, comprising antenna configuration information related to the DUT 201.

For example, the interface 401 may comprise or be a cable connection interface, e.g. a Universal Serial Bus (USB) interface or port, to receive the image data 200 and/or the tabular data 300 in digital form.

Additionally or alternatively, the interface 401 may comprise or be a wireless connection interface, e.g. a Wireless Local Area Network (WLAN) interface or port, to receive the image data 200 and/or the tabular data 300 in digital form.

Additionally or alternatively, the interface 401 may comprise a camera configured to capture an image, e.g. from the data sheet of the DUT 201, to provide the image data 200 and/or the tabular data 300 in digital form.

Additionally or alternatively, the interface 401 may comprise a scanner to provide the image data 200 and/or the tabular data 300 in digital form, e.g. from the data sheet of the DUT 201.

The TM system 400 may further comprise a processor 402 coupled to the interface 401, whereby the processor 402 may receive the image data 200 and/or the tabular data 300 from the interface 401. The processor 402 may comprise or be one or more application specific integrated circuits (ASICs), digital signal processors (DSPs), digital signal processing devices (DSPDs), programmable logic devices (PLDs), field programmable gate arrays (FPGAs), controllers, microcontrollers, microprocessors, or the like.

The TM system 400 may further comprise a memory, which stores one or more instruction(s) that can be executed by the processor 402. For instance, the memory may comprise a non-transitory storage medium storing executable software code which, when executed by the processor 402 causes the various operations of the TM system 400 to be performed.

The TM system 400 may further comprise a database 404, e.g. an application database or repository 404, coupled to the interface 401 and further to the processor 402. The processor 402 may receive the image data 200 and/or the tabular data 300 from the interface 401 via the database 404.

The database 404 may be a local database or a remote database, e.g. a cloud database. In case the database 404 is a remote database, the processor 402 may be configured to communicate with the database 404 via the interface 401, especially wirelessly.

The TM system 400 may further comprise a network emulator 403 coupled to the processor 402 and further to the DUT 201. The network emulator 403 may comprise routing paths or connectors, e.g. comprising switchable signal routing connectors, especially coupled to the antennas of the DUT 201. The processor 402 may configure the network emulator 403 to generate a test signal or may supply the test signal to the network emulator 403, and may further configure the network emulator 403 to route the test signal to one or more target antennas of the DUT 201.

It is to be noted that the settings of the TM system 400 may correspond to the settings of the network emulator 403, especially the settings corresponding to the routing paths or antenna connectors of the network emulator 403, for switching and correspondingly routing one or more test signals to one or more respective DUT antennas. The settings for selection of the routing paths or antenna connectors may correspond to the antenna specific frequency band, network specific protocol, antenna diversity, or the like, and may be extracted from the image data 200 and/or the tabular data 300 by the processor 402.

For example, the interface 401 may provide or receive the image data 200 and/or the tabular data 300 in digital form, and the processor 402 may receive the image data 200 and/or the tabular data 300 accordingly. The processor 402 may perform pattern recognition and/or image processing of the image data 200 and/or the tabular data 300 to extract the antenna configuration of the DUT 201. For example, the processor 402 may recognize the texts in the image data 200 and/or the tabular data 300 by means of Optical Character Recognition (OCR), or other techniques for text identification in an image known in the art.

For instance, in order to train the algorithms to perform pattern recognition and/or image processing of the image data 200 and/or the tabular data 300, the interface 401 may provide or receive reference data sheets, and may store the reference data sheets in the database in digital form. Normally, the data sheets contain repeating patterns, and the patterns may be used to train to the algorithms in order to extract the target information from the image data 200 and/or the tabular data 300.

As such, upon extracting the useful information from the image data 200 and/or the tabular data 300, to obtain the antenna configuration and store it into the settings, e.g. the antenna specific band information, diversity, orientation, protocol information, and the like, the processor 402 may configure the network emulator 403 to emulate a network for signals to be routed using the current configuration of the DUT antennas, especially to the correct antennas of the DUT 201, e.g. with matching connector properties.

Therefore, the embodiments of this disclosure effectively eliminate the manual insertion of data sheet information in terms of DUT antenna configuration. The embodiments of this disclosure advantageously facilitate automatic insertion of DUT antenna configuration from data sheets, especially using pattern recognition and/or image processing, to facilitate more flexible and less error prone en masse DUT testing and measurement.

It is important to note that, in the description as well as in the claims, the word "comprising" does not exclude other elements or steps and the indefinite article "a" or "an" does not exclude a plurality. A single element or other unit may fulfill the functions of several entities or items recited in the claims. Furthermore, the word "coupled" implies that the elements may be directly connected together or may be coupled through one or more intervening elements. Moreover, the disclosure with regard to any of the aspects is also relevant with regard to the other aspects of the disclosure.

Although the disclosure has been illustrated and described with respect to one or more implementations, equivalent alterations and modifications will occur to others skilled in the art upon the reading and understanding of this specification and the annexed drawings. In addition, while a particular feature of this disclosure may have been disclosed with respect to only one of several implementations, such feature may be combined with one or more other features of the other implementations as may be desired and advantageous for any given or particular application.

What is claimed is:

1. A method comprising:

receiving, by an interface of a test and measurement (TM) system configured to test a device under test (DUT), data comprising antenna configuration information related to a configuration for one or more antennas of the DUT;

extracting the antenna configuration for at least one of the one or more antennas of the DUT from the antenna configuration information in a digital domain using a pattern recognition algorithm; and storing the extracted antenna configuration in a memory of the TM system into settings of the TM system; and wherein the data comprising the antenna configuration information is image data or text data, wherein the data comprising the antenna configuration information comprises one or more annotations superposed on an image of the DUT, and wherein the one or more annotations further indicate an antenna specific frequency band mapping.

2. The method according to claim 1, wherein the method further comprises:

routing, by an emulator of the TM system, at least one test signal to at least one of the one or more antennas of the DUT based on the antenna configuration for the DUT stored in the settings of the TM system.

3. The method according to claim 1, wherein the extracting of the antenna configuration for the at least one of the one or more antennas of the DUT from the antenna configuration information is performed in the digital domain using an image pattern recognition algorithm and/or an image processing algorithm.

4. The method according to claim 3, wherein the method further comprises:

performing the image pattern recognition algorithm and/or the image processing algorithm based on reference image data comprising reference antenna configuration information as training data.

5. The method according to claim 1, wherein the data comprising the antenna configuration information is in a tabular form.

6. The method according to claim 1, wherein the data comprising the antenna configuration information corresponds to a product specification datasheet of the DUT.

7. The method according to claim 3, wherein:

the data comprising the antenna configuration information is received as a JPEG file;

the method further comprises determining one or more regions of interest indicating the antenna configuration information in the JPEG file; and the antenna configuration for the at least one of the one or more antennas of the DUT is extracted from the one or more regions of interest.

8. A test and measurement (TM) system comprising:

an interface configured to receive data comprising antenna configuration information related a configuration for one or more antennas of a device under test (DUT);

a processor operably coupled to the interface and configured to extract the antenna configuration for at least one of the one or more antennas of the DUT from the antenna configuration information in a digital domain using a pattern recognition algorithm; and a memory; and wherein the processor is further configured to store the extracted antenna configuration in the memory as settings of the TM system, wherein the data comprising the antenna configuration information-related to the DUT is image data or text data, wherein the data comprising the antenna configuration information comprises one or more annotations superposed on an image of the DUT, and wherein the one or more annotations further indicate an antenna specific frequency band mapping.

9. The TM system according to claim 8, further comprising:

a network emulator operably coupled to the processor and configured to route at least one test signal to at least one of the one or more antennas of the DUT based on the antenna configuration for the DUT stored in the settings of the TM system.

10. The system according to claim 8, wherein the processor is configured to perform the extracting of the antenna configuration for the at least one of the one or more antennas of the DUT in the digital domain using an image pattern recognition algorithm and/or image processing algorithm.

11. The system according to claim 10, wherein the processor is configured to perform the image pattern recognition algorithm and/or the image processing algorithm based on-the training data to extract the antenna configuration for the at least one of the one or more antennas of the DUT.

12. The system according to claim 8 further comprising:

a database operably coupled to the interface, and configured to store reference image data comprising reference antenna configuration information as the training data.

13. The system according to claim 12, wherein the processor is configured to perform the pattern recognition algorithm and/or the image processing algorithm based on the training data.

14. The system according to claim 10, wherein the interface is configured to receive the image data by means of a digital capture and/or scanning and/or inputting of the image data.

* * * * *